US009530961B2

(12) United States Patent
Yi et al.

(10) Patent No.: US 9,530,961 B2
(45) Date of Patent: Dec. 27, 2016

(54) MASK ASSEMBLY FOR DEPOSITION, DEPOSITION APPARATUS, AND METHOD EMPLOYING THE SAME

(71) Applicant: Samsung Display Co., Ltd., Yongin (KR)

(72) Inventors: Sangmin Yi, Yongin (KR); Mingoo Kang, Yongin (KR); Minchul Song, Yongin (KR); Sangshin Lee, Yongin (KR); Sangyun Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/697,925

(22) Filed: Apr. 28, 2015

(65) Prior Publication Data

US 2016/0079532 A1 Mar. 17, 2016

(30) Foreign Application Priority Data

Sep. 17, 2014 (KR) ......................... 10-2014-0123709

(51) Int. Cl.
*H01L 51/00* (2006.01)
*H01L 51/56* (2006.01)

(52) U.S. Cl.
CPC ........... *H01L 51/0002* (2013.01); *H01L 51/56* (2013.01)

(58) Field of Classification Search
CPC .... H01L 51/0011; H01L 51/56; H01L 21/673; H01L 21/68742; H01L 51/0002
See application file for complete search history.

(56) References Cited

U.S. PATENT DOCUMENTS

| 8,631,761 B2 * | 1/2014 | Kang ................... C23C 14/042 118/504 |
| 8,707,894 B2 * | 4/2014 | Lee ....................... C23C 14/042 118/504 |
| 9,238,276 B2 * | 1/2016 | Kang ..................... B23K 31/02 |
| 2003/0221614 A1 * | 12/2003 | Kang ................... C23C 14/042 118/504 |
| 2006/0240669 A1 * | 10/2006 | Kaneko ................. C23C 14/042 438/680 |
| 2007/0137571 A1 * | 6/2007 | Kim ...................... C23C 14/042 118/721 |
| 2010/0192856 A1 * | 8/2010 | Sung ..................... C23C 14/042 118/721 |
| 2011/0139069 A1 | 6/2011 | Ahn et al. |

(Continued)

FOREIGN PATENT DOCUMENTS

| JP | 2004-146251 | 5/2004 |
| JP | 2009-091626 | 4/2009 |

(Continued)

*Primary Examiner* — Jaehwan Oh
(74) *Attorney, Agent, or Firm* — H.C. Park & Associates, PLC

(57) ABSTRACT

Disclosed is a mask assembly for deposition including: a frame having an opening; a mask having at least one pattern part formed in a second direction that is different from a first direction, wherein at least a portion of the mask is supported by the frame and the at least one pattern part has one or more slits continuously formed in the first direction; and at least one support stick extending in the second direction across the opening so as to support at least a portion of the mask.

11 Claims, 5 Drawing Sheets

(56) References Cited

U.S. PATENT DOCUMENTS

2011/0174217 A1\* 7/2011 Gersdorff .............. C23C 16/042
 118/500
2014/0329032 A1\* 11/2014 Li ........................ C23C 14/042
 427/598

FOREIGN PATENT DOCUMENTS

| KR | 10-2007-0090018 | 9/2007 |
| KR | 10-2010-0000129 | 1/2010 |
| KR | 10-1030030 | 4/2011 |

\* cited by examiner

MASK ASSEMBLY FOR DEPOSITION, DEPOSITION APPARATUS, AND METHOD EMPLOYING THE SAME

CROSS REFERENCE TO RELATED APPLICATION

This application claims priority from and the benefit of Korean Patent Application No. 10-2014-0123709, filed on Sep. 17, 2014, which is incorporated by reference for all purposes as if fully set forth herein.

BACKGROUND

1. Field

Exemplary embodiments of the present invention relate to a deposition apparatus and method for depositing a material on a surface of a substrate by vaporizing the deposition material and discharging the vaporized deposition material from a deposition source. More particularly, exemplary embodiments of the present invention relate to a deposition apparatus and method of deposition employing a mask assembly.

2. Discussion of the Background

Among various display apparatuses, organic light-emitting display apparatuses have wide viewing angles, good contrast, and quick response times. Thus, organic light-emitting display apparatuses have been highlighted as next-generation display apparatuses.

An organic light-emitting display apparatus typically includes a first electrode, a second electrode, and an intermediate layer. The intermediate layer includes an emission layer and is disposed between the first electrode and the second electrode. The first and second electrodes and the intermediate layer may be formed by various methods, one of which is an independent deposition method. To manufacture an organic light-emitting display apparatus using the independent deposition method, an organic layer of a predetermined pattern is formed by closely attaching a fine metal mask (FMM) having the same pattern as that of the organic layer, etc. to be formed to a surface of a substrate on which the organic layer, etc. are to be formed. Materials are deposited to form the organic layer, etc.

Information disclosed in this Background section was already known to the inventors before achieving the inventive concept or is technical information acquired in the process of achieving the inventive concept. Therefore, it may contain information that does not form the prior art that is already known to the public in this country.

SUMMARY

Exemplary embodiments of the present invention provide a mask assembly for deposition, a deposition apparatus, and a method employing the same.

Additional aspects will be set forth in part in the description which follows and, in part, will be apparent from the description, or may be learned by practice of the presented embodiments.

An exemplary embodiment of the present invention discloses a mask assembly for deposition, including: a frame having an opening; a mask having at least one pattern part formed in a second direction that is different from a first direction, wherein at least a portion of the mask is supported by the frame and the at least one pattern part has one or more slits continuously formed in the first direction; and at least one support stick formed extending in the second direction across the opening so as to support at least a portion of the mask.

An exemplary embodiment of the present invention also discloses a deposition method, the method including: disposing a mask onto one surface of a substrate in a chamber; disposing a magnet plate onto another surface of the substrate; and depositing a vapored deposition material from a deposition source onto the substrate through slits formed in the mask, wherein at least a portion of the mask is supported by a frame, the mask has at least one pattern part formed in a second direction that is different from a first direction, the at least one pattern part has one or more slits continuously formed in the first direction, and at least a portion of the mask is supported by at least one support stick extending in the second direction across the opening.

It is to be understood that both the foregoing general description and the following detailed description are exemplary and explanatory and are intended to provide further explanation of the invention as claimed.

BRIEF DESCRIPTION OF THE DRAWINGS

These and/or other aspects will become apparent and more readily appreciated from the following description of the exemplary embodiments, taken in conjunction with the accompanying drawings.

DETAILED DESCRIPTION OF THE ILLUSTRATED EMBODIMENTS

Figure 1:
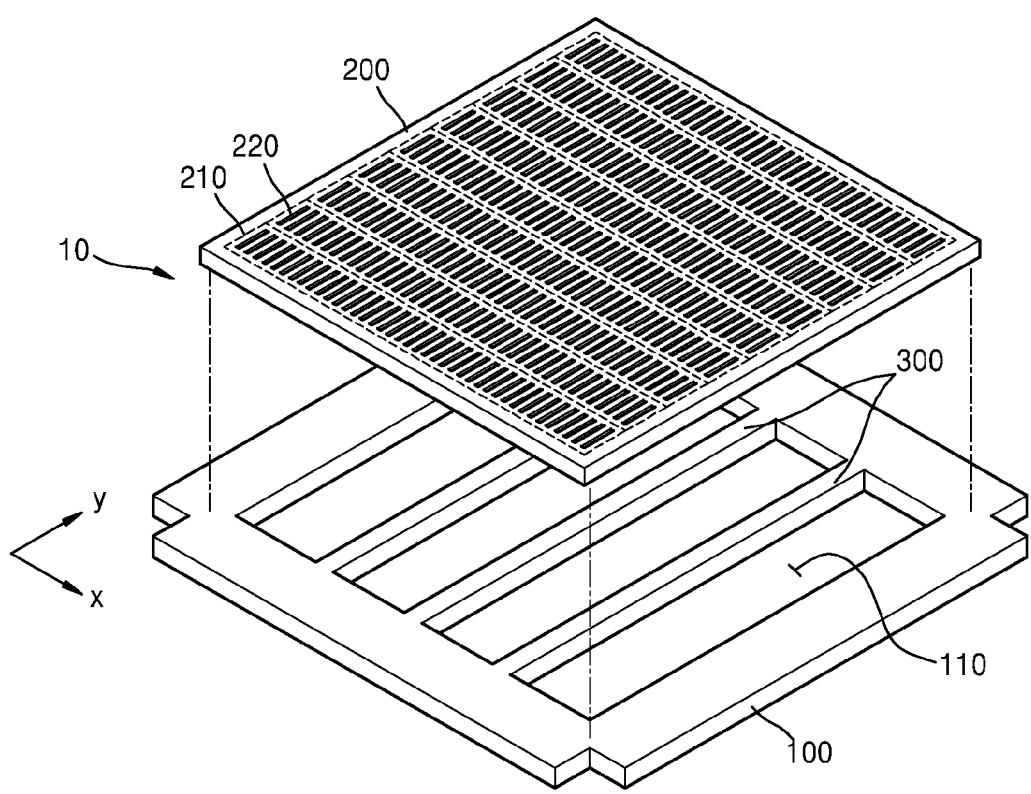
FIG. 1 is a perspective view of a mask assembly for deposition according to an exemplary embodiment of the inventive concept.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

First, as an example of a deposition process, an instance of forming an organic layer of an organic light-emitting display apparatus will be described. When the organic layer is formed, it may cover a display unit by attaching a mask to a substrate and depositing an organic material. To firmly attach the mask to the substrate, a magnet plate is generally mounted on a surface or a substrate which is opposite to a mask-contacting surface of the substrate. That is, a magnetic force of the magnet plate pulls the mask towards the substrate to thereby to firmly attach the mask to the substrate.

The magnet plate may include a plurality of permanent magnets disposed at set intervals to form a magnetic force. The magnetic force applied to the mask may vary according to the arrangement of effective regions of the mask and locations of the permanent magnets. Specifically, when inter-row ribs formed between the effective regions of the mask are located between the permanent magnets, the mask is not pulled towards the substrate. Rather, a repulsive force is generated, thereby decreasing the adhesion of the mask to the substrate.

In this case, since the magnetic force is not uniformly applied to the mask, a lifting phenomenon may occur locally such that the substrate and the mask may not fully contact each other. This may cause a deposition material to be deposited in an undesired region on a large-sized substrate, thereby resulting in a bad product.

Exemplary embodiments provide a mask assembly for deposition, a deposition apparatus, and a deposition method employing the same. A mask assembly for deposition according to an exemplary embodiment of the inventive concept will now be described with reference to FIG. 1.

FIG. 1 is a perspective view of a mask assembly 10 for deposition according to an exemplary embodiment of the inventive concept.

As shown in FIG. 1, the mask assembly 10 for deposition according to an exemplary embodiment of the inventive concept includes a frame 100 having an opening 110 and a mask 200, at least a portion of which is supported by the frame 100. Mask assembly 10 has at least one pattern part 210 formed in a second direction (y-axis direction in FIG. 1) that is different from a first direction (x-axis direction in FIG. 1). The first and second directions may be perpendicular to each other, although this configuration is merely exemplary. Each pattern part 210 has one or more slits 220 continuously formed in the first direction, and at least one support stick 300 formed so as to cross the opening 110. Support stick 300 may be formed by extending in the second direction in the opening 110 so as to support at least a portion of the mask 200.

Referring to FIG. 1, the frame 100 is formed so as to support an edge of the mask 200, and the mask 200 having a plurality of pattern parts 210 is closely attached to the frame 100. Each pattern part 210 has a plurality of slits 220, the slits disposed parallel to each other in the first direction.

In a comparative example (not shown), a plurality of pattern parts may be formed in the first direction, and ineffective regions through which a deposition material cannot pass during deposition, i.e., inter-row ribs (not shown), are formed between the pattern parts.

However, in the mask assembly 10 for deposition according to the exemplary embodiment of the inventive concept, one pattern part 210 is formed in the first direction, and slits 220 through which a deposition material passes are continuously formed with a predetermined interval on the pattern part 210. Therefore, the inter-row ribs of the comparative example, which are used for identifying the plurality of pattern parts formed in the first direction, do not exist in the exemplary embodiment of the inventive concept, and the slits 220 are continuously formed at the places where the inter-row ribs are located in the comparative example. Therefore, as a result, the slits 220 (which are discontinuously disposed due to the inter-row ribs present in the comparative example) are continuously formed in the first direction on the pattern part 210 according to the exemplary embodiment of the inventive concept. In this case, the intervals between the plurality of slits 220 may be different between different slits.

In the comparative example, inter-row ribs are generally used to identify corresponding pattern parts, and prevent a decrease in adhesion of glass closely attached to upper and lower surfaces of a substrate during an encapsulation process. However, a decrease in adhesion may occur as a result of the inter-row ribs being located in a region where a deposition material should not be deposited during the encapsulation process for isolating the substrate. The decrease in adhesion may occur after forming a deposition film on the substrate as a result of humidity and oxygen.

Conversely, the mask assembly 10 for deposition according to an exemplary embodiment of the inventive concept is characterized in that the support sticks 300 are disposed in the regions where inter-row ribs may have been located in the comparative example.

As described above, and according to an exemplary embodiment of the inventive concept, the slits 220 are continuously disposed, instead of the inter-row ribs for identifying the corresponding pattern parts (as used in the comparative example). The support sticks 300 have similar characteristics of the inter-row ribs. Thus, a magnetic force may be uniformly applied to the mask 200 regardless of an arrangement state of permanent magnets 410 (referring to FIG. 5) to be described below, thereby resulting in an increase in adhesion of the mask 200 to a substrate S (referring to FIG. 5) during a deposition process.

Figure 2:
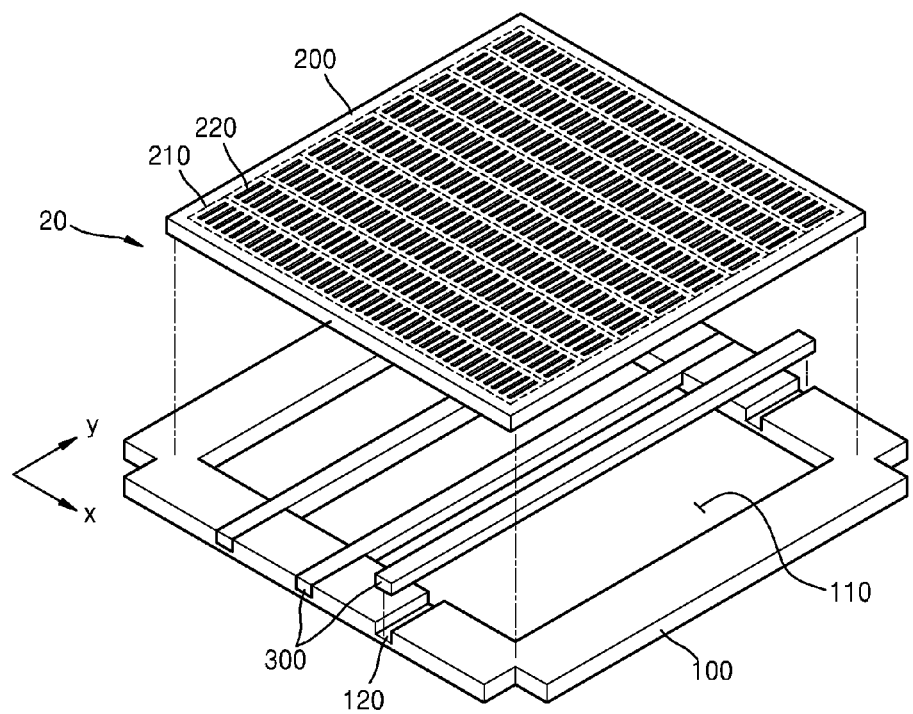
FIG. 2 is a perspective view of a mask assembly for deposition according to an exemplary embodiment of the inventive concept.

FIG. 2 is a perspective view of a mask assembly 20 for deposition according to an exemplary embodiment of the inventive concept.

The support stick 300 of the mask assembly 20 according to the exemplary embodiment shown in FIG. 2 may extend in the second direction (y-axis direction in FIG. 2) as one body with the frame 100, as shown in FIG. 1. However, unlike the embodiment shown in FIG. 1, the support stick 300 may be coupled to the frame 100 such that both ends of the support stick 300 are accommodated in grooves 120 formed on the frame 100, as shown in FIG. 2. Although FIG. 2 illustrates a form in which the support stick 300 is inserted into and fixed by the grooves 120, the exemplary embodiments of the inventive concept are not limited thereto, and various methods, e.g., welding, bolt-nut coupling, and the like, may be used.

Figure 3:
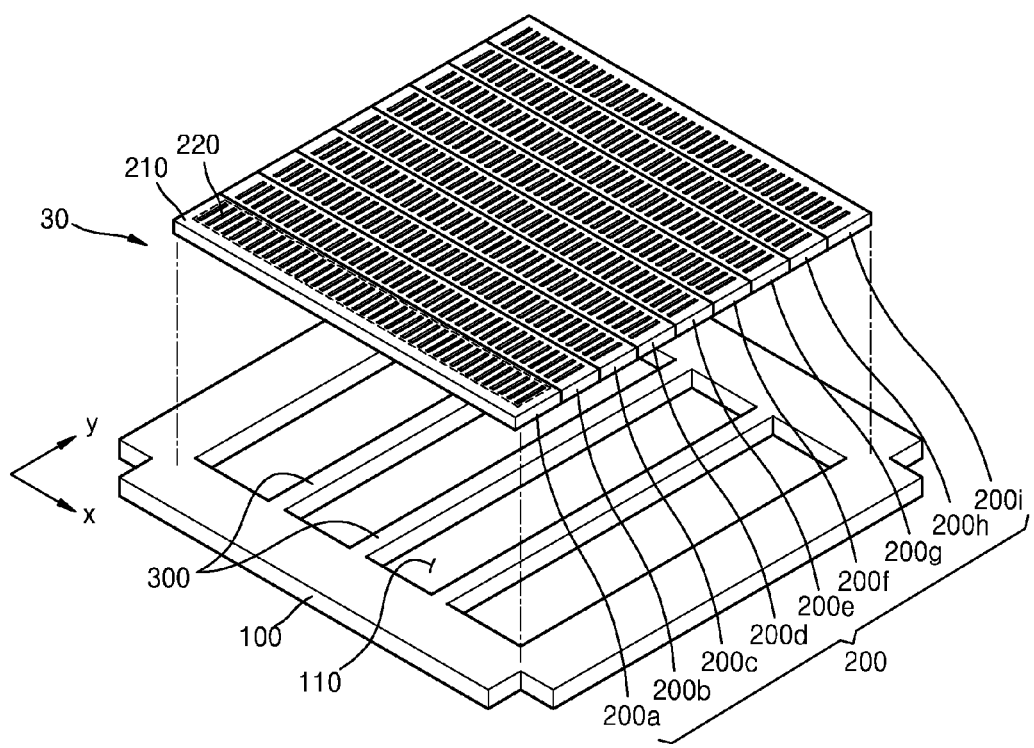
FIG. 3 is a perspective view of a mask assembly for deposition according to an exemplary embodiment of the inventive concept.

FIG. 3 is a perspective view of a mask assembly 30 for deposition according to an exemplary embodiment of the inventive concept.

FIGS. 1 and 2 illustrate a form in which the plurality of pattern parts 210 are disposed on the mask 200 in the second direction that is different from the first direction, but, as shown in FIG. 3, the plurality of pattern parts 210 may be separated, thereby forming a plurality of division masks 200a, 200b, 200c, 200d, 200e, 200f, 200g, 200h, and 200i of the mask assembly 30 according to FIG. 3.

Referring to FIG. 3, the mask assembly 30 according to an exemplary embodiment of the inventive concept may include division masks 200a, 200b, 200c, 200d, 200e, 200f, 200g, 200h, and 200i obtained by dividing the mask 200 into the division masks. Herein, the number of division masks may vary, and may be larger or smaller than the number of division masks shown in FIG. 3.

Figure 4:
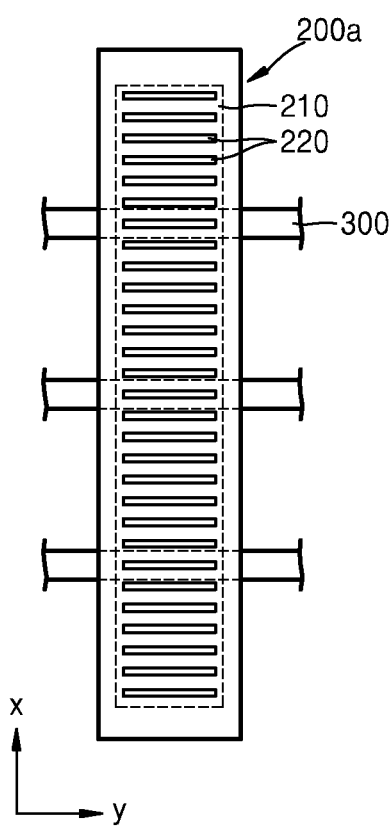
FIG. 4 is a top view of a combination structure of a division mask and support sticks in the mask assembly for deposition of FIG. 3.

FIG. 4 is a top view of a combination structure of the division mask 200a and the support sticks 300 in the mask assembly 30 of FIG. 3. Since the division masks 200a, 200b, 200c, 200d, 200e, 200f, 200g, 200h, and 200i have a same shape, only exemplary division mask 200a will be described as below for convenience.

Referring to FIG. 4, one pattern part 210 having slits 220 continuously formed in the first direction (x-axis direction in FIG. 4) as described above is formed on the division mask 200a. In this case, the support sticks 300 cover the division mask 200a and are disposed in regions of the slits 220 through which a deposition material should not pass and not be deposited on a substrate.

Although FIG. 4 illustrates a form in which three support sticks 300 support the division mask 200a, exemplary embodiments are not limited thereto, and various modifications may be performed such that one or more support sticks 300 support the division mask 200a.

Figure 5:
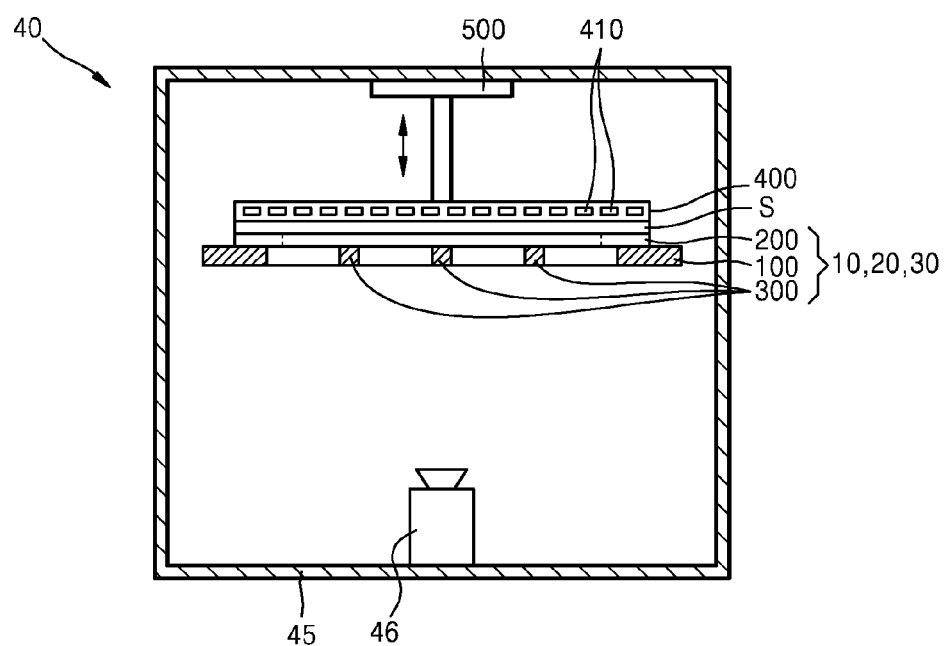
FIG. 5 illustrates a deposition apparatus employing the mask assembly for deposition of FIG. 1, 2, or 3, according to an exemplary embodiment of the inventive concept.

FIG. 5 illustrates a deposition apparatus 40 employing the mask assembly 10, 20, or 30 of FIG. 1, 2, or 3, according to an exemplary embodiment of the inventive concept.

Referring to FIG. 5, the deposition apparatus 40 includes the mask assembly 10, 20, or 30 for deposition, which includes the frame 100, the mask 200, and the support sticks 300, and a magnet plate 400. The magnet plate 400 may apply a predetermined magnetic force to the mask 200, and may be formed on the opposite surface of substrate S from frame 100, mask 200, and support sticks 300. One surface of substrate S contacts the mask 200.

The magnet plate 400 may include one or more permanent magnets 410, and the magnet plate 400 may be elevated by an elevation unit 500 to apply the predetermined magnetic force to the mask 200 during a deposition process. In this manner, the mask 200 is closely attached to the substrate S.

The deposition apparatus 40 including the mask assembly 10, 20, or 30 for deposition with the configuration described above may be operated as recited below.

In a case where an organic layer is deposited in an organic light-emitting display apparatus, the substrate S of the organic light-emitting display apparatus is prepared in a chamber 45. The mask 200 is disposed on one surface of the substrate S and the magnet plate 400 is disposed on the other surface of the substrate S. The mask 200, the substrate S, and the magnet plate 400 are mounted in the chamber 45.

Thereafter, a deposition source 46 for vaporizing and spraying a deposition material for the organic layer is prepared to start the deposition process. The deposition material for the organic layer is deposited on the substrate S through the slits 220 formed in the mask 200, thereby forming the organic layer.

At least a portion of the mask 200 used for this deposition method is supported by the frame 100, and the mask 200 has at least one pattern part 210 formed in the second direction that is different from the first direction. Each pattern part 210 has one or more slits 220 and is continuously formed in the first direction. In this case, the slits 220 may be formed at a same interval or different intervals.

The mask 200 is supported by a support stick 300. The support stick 300 may extend in the second direction y as a single body with the frame 100, as shown in FIG. 1, or may be coupled to the frame by a way in which both ends of the support stick 300 are disposed in the grooves 120 formed in the frame 100, as shown in FIG. 2. However, the grooves 120 and the support stick 300 may be coupled to each other by various methods, such as welding, bolt-nut coupling, as described above.

Further, the magnet plate 400 used in the deposition method may include a plurality of permanent magnets 410 and may be closely attached to the substrate S by the elevation unit 500 during a deposition process as described above.

As described above, according to the mask assembly for a deposition process, the deposition apparatus including the same, and the deposition method using the same, according to the above exemplary embodiments, adhesion between a mask and a substrate used in the deposition process is improved.

It should be understood that the exemplary embodiments described therein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A mask assembly for deposition, comprising:
   a frame comprising an opening;
   a mask comprising at least one pattern part extending in a second direction, the second direction being different from a first direction; and
   at least one support stick extending in the second direction across the opening and supporting a first portion of the mask,
   wherein:
   a second portion the mask is supported by the frame; and
   each pattern part comprises a plurality of slits continuously disposed in the first direction at a constant interval over the opening and the at least one support stick.

2. The mask assembly for deposition of claim 1, wherein grooves are disposed in the frame, and both ends of the at least one support stick are accommodated in the grooves.

3. The mask assembly for deposition of claim 1, wherein the mask comprises a plurality of division masks.

4. A deposition apparatus, comprising:
   a mask assembly for deposition comprising:
      a frame comprising an opening;
      a mask comprising at least one pattern part extending in a second direction, the second direction being different from a first direction; and
      at least one support stick extending in the second direction across the opening and supporting a first portion of the mask,
      wherein:
      a second portion the mask is supported by the frame; and
      each pattern part comprises a plurality of slits continuously disposed in the first direction at a constant interval over the opening and the at least one support stick; and
   a magnet plate disposed on a surface of the substrate different from a surface of the substrate contacting the mask, and configured to apply a magnetic force to the mask.

5. The mask deposition apparatus of claim 4, wherein grooves are disposed in the frame, and both ends of the at least one support stick is disposed in the grooves.

6. The deposition apparatus of claim 4, wherein the magnet plate comprises one or more permanent magnets.

7. The deposition apparatus of claim 4, further comprising an elevation unit configured to elevate the magnet plate.

8. The deposition apparatus of claim 4, further comprising an elevation unit configured to elevate the magnet plate.

9. The deposition apparatus of claim 5, further comprising an elevation unit configured to elevate the magnet plate.

10. The deposition apparatus of claim 6, further comprising an elevation unit configured to elevate the magnet plate.

11. The mask assembly for deposition of claim 1, wherein the at least one support stick is integrally formed with the frame.

\* \* \* \* \*